United States Patent [19]

Tikhonov

[11] Patent Number: 5,952,838
[45] Date of Patent: Sep. 14, 1999

[54] RECONFIGURABLE ARRAY OF TEST STRUCTURES AND METHOD FOR TESTING AN ARRAY OF TEST STRUCTURES

[75] Inventor: Victor Tikhonov, San Antonio, Tex.

[73] Assignees: Sony Corporation; Sony Electronics, Inc., Park Ridge, N.J.

[21] Appl. No.: 08/619,220

[22] Filed: Mar. 21, 1996

Related U.S. Application Data

[60] Provisional application No. 60/000,398, Jun. 21, 1995.

[51] Int. Cl.[6] ............................ G01R 31/02; G01R 31/28
[52] U.S. Cl. ............................................ 324/754; 324/765
[58] Field of Search .................................. 324/765, 754, 324/537, 766, 767

[56] References Cited

U.S. PATENT DOCUMENTS

| | | | |
|---|---|---|---|
| 4,956,602 | 9/1990 | Parrish | 324/537 |
| 4,961,053 | 10/1990 | Krug | 324/537 |
| 5,341,092 | 8/1994 | El-Ayat et al. | 324/765 |
| 5,532,614 | 7/1996 | Chiu | 324/765 |

*Primary Examiner*—Ernest F. Karlsen
*Attorney, Agent, or Firm*—Ronald P. Kananen

[57] ABSTRACT

A reconfigurable array of test structures for testing portions of a semiconductor device, comprising a plurality of probe pads, comprising a first probe pad and a remainder of probe pads, at least one of which remainder of probe pads is a common lead; to each of said plurality of probe pads, except for said common lead, are attached two conductors; in each of which said two conductors is connected a test structure, a first end of which semiconductor device is connected to said conductor and a second end of which test structure is connected to said common lead, except for said first probe pad, for which first probe pad only a test structure is connected in the first conductor of the two conductors and a fusible link in the second conductor of the two conductors connected to said common lead; wherein one of each of said two conductors contains a fusible link connected in series with said test structure; and a method for testing portions of a semiconductor device employing such a reconfigurable array of test structures are described.

16 Claims, 2 Drawing Sheets

RECONFIGURABLE ARRAY OF TEST STRUCTURES AND METHOD FOR TESTING AN ARRAY OF TEST STRUCTURES

This application claims benefit of Provisional Appln 60/000,398 filed Jun. 21, 1995.

BACKGROUND OF THE INVENTION

1. Field of the Invention

The present invention pertains to a reconfigurable array of test structures and a method for testing test structures employing a reconfigurable array of test structures.

2. Discussion of the Background

In semiconductor manufacturing, semiconductor devices are not typically constructed individually, but rather in multiples, frequently large multiples. For example, in the manufacture of a semiconductor device, several hundred or more devices will be prepared simultaneously on a single substrate. This substrate or sheet will later be die-cut to provide the individual semiconductor devices. During the step-wise assembly of the semiconductor devices, it is advantageous to test, occasionally more than once, portions of the partially assembled or the completely assembled semiconductor devices so as to monitor the manufacturing process and to identify the malfunctioning devices.

Further, in semiconductor manufacturing, there is significant economic pressure to reduce the costs of manufacturing. Thus, there is a greatly increased demand for maximizing the number of semiconductor devices that can be assembled on a given substrate. Unfortunately, this demand has made it increasingly difficult to justify the space allocated for parameter test structures on the semiconductor device, which occupy a significant amount of valuable substrate area and do not serve any further purpose after the test measurements have been performed. These parameter test structures represent underutilized or "dead" space on the semiconductor device, which space, if properly utilized could either provide additional semiconductor devices, for example, memory chips, PAL, and CPU; or optimize the die layout on the silicon wafer.

Conventional parameter test structures are very small, but the probe pads through which the testing equipment access these structures, must be quite large so as to accommodate inaccurate alignment or minor misalignment of the testing equipment and to ensure satisfactory electrical contacts. Accordingly, conventional manufacture of test structures results in a significant amount of substrate area that is not incorporated into a semiconductor device and which does not serve any purpose after the manufacturing process.

To address this wasted substrate area, various approaches have been pursued in an attempt to increase the area of utilized substrate. These approaches have included decreasing the size of the probe pads, placing the parameter test structure outside the scribe lines of the die, and allocating portions of the die for testing purposes only. These approaches are described in U.S. Pat. No. 4,014,037 to Matsushita et al.; U.S. Pat. No. 4,041,399 to Tsuda; U.S. Pat. No. 4,063,275 to Matsushita et al.; U.S. Pat. No. 4,302,763 to Ohuchi et al.; U.S. Pat. No. 4,176,372 to Matsushita et al.; U.S. Pat. No. 4,198,283 to Class et al.; U.S. Pat. No. 4,302,763 to Ohuchi et al.; U.S. Pat. No. 4,771,009 to Ueki; U.S. Pat. No. 5,068,697 to Noda et al.; U.S. Pat. No. 5,102,819 to Matsushita et al.; U.S. Pat. No. 5,126,028 to Hurwitt et al.; U.S. Pat. No. 5,243,213 to Miyazawa et al.; U.S. Pat. No. 5,334,555 to Sugiyama et al.; U.S. Pat. No. 5,342,652 to Foster et al.; U.S. Pat. No. 5,349,456 to Iwanaga et al.; U.S. Pat. No. 5,360,524 to Hendel et al.; and U.S. Pat. No. 5,377,030 to Suzuki et al. Unfortunately, these approaches have achieved only small increases, if any, in the utilized area of the substrate. Accordingly, there remains a need for a method of semiconductor manufacture which results in a significant increase in the utilized area of semiconductor substrate.

SUMMARY OF THE INVENTION

Accordingly, an object of the present invention is to provide a novel reconfigurable array of test structures for testing semiconductor devices.

It is another object of the present invention to provide a method for testing portions of a semiconductor device employing a reconfigurable array of test structures.

It is yet another object of the present invention to maximize the number of semiconductor devices which can be assembled on a given area of substrate.

It is another object of the present invention to provide a means for maximizing the amount of test information from test structures, while minimizing the die area occupied by the regions which furnish the test information from the parameter test structures.

These and other objects have been achieved by means of a reconfigurable array of test structures for testing portions of a semiconductor device, one embodiment of which comprises a plurality of probe pads, comprising a first probe pad and a remainder of probe pads, at least one of which remainder of probe pads is a common lead; to each of said plurality of probe pads, except for said common lead, are attached two conductors; in each of which said two conductors is connected a test structure, a first end of which test structure is connected to said conductor and a second end of which test structure is connected to said common lead, except for said first probe pad, for which first probe pad only a test structure is connected in the first conductor of the two conductors and a fusible link in the second conductor of the two conductors connected to said common lead; wherein one of each of said two conductors contains a fusible link connected in series with said test structure. In another embodiment of the present invention, a microprobing pad is placed on a conductive path connecting in series the fusible link and the test structure.

These and other objects have also been achieved by means of a reconfigurable array of test structures for testing a semiconductor device, one embodiment of which comprises a plurality of probe pads, at least one of which plurality of probe pads is a common lead; to each of said plurality of probe pads, except for said common lead, are attached two conductors; in each of which said two conductors is connected a test structure, a first end of which test structure is connected to said conductor and a second end of which test structure is connected to said common lead; wherein one of each of said two conductors contains a fusible link connected in series with said test structure. In another embodiment of the present invention, a microprobing pad is placed on a conductive path connecting in series the fusible link and the test structure.

These and other objects have also been achieved by means of a method of testing portions of a semiconductor device, one embodiment of which comprises the steps of assembling a plurality of test structures in a reconfigurable array of test structures, which reconfigurable array of test structures comprises: a plurality of probe pads, at least one of which probe pads is a common lead; to each of said plurality of probe pads, except for said common lead, are attached two conductors; in each of which said two conductors is connected one of said plurality of test structures, wherein one of each of said two conductors contains a fusible link connected in series with said test structure; making a first set of measurements between each of said plurality of probe pads and said common lead; breaking or disconnecting the fusible link connected in series with said test structure; making a second set of measurements between each of said plurality of probe pads and said common lead; and correlating said first set of measurements with said second set of measurements so as to obtain an individual parameter measurement for each test structure. In another embodiment of the present invention, a microprobing pad is placed on a conductive path connecting in series the fusible link and the test structure.

These and other objects have also been achieved by means of a method of testing portions of a semiconductor device, one embodiment of which comprises the steps of assembling a plurality of test structures in a reconfigurable array of test structures, which reconfigurable array of test structures comprises: a plurality of probe pads, comprising a first probe pad and a remainder of probe pads, at least one of which remainder of probe pads is a common lead; to each of said plurality of probe pads, except for said common lead, are attached two conductors; in each of which said two conductors is connected one of said plurality of test structures, a first end of which test structure is connected to said conductor and a second end of which test structure is connected to said common lead, except for said first probe pad, for which first probe pad only a test structure is connected in the first conductor of the two conductors and a fusible link in the second conductor of the two conductors connected to said common lead; wherein one of each of said two conductors contains a fusible link connected in series with said test structure; making a first set of measurements between each of said plurality of probe pads and said common lead; breaking or disconnecting the fusible link connected in series with said test structure; making a second set of measurements between each of said plurality of probe pads and said common lead; and correlating said first set of measurements with said second set of measurements so as to obtain an individual parameter measurement for each test structure. In another embodiment of the present invention, a microprobing pad is placed on a conductive path connecting in series the fusible link and the test structure.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

The present invention provides a method for reducing by almost half the number and area of the probe pads for parameter testing, while maintaining the same number of test structures tested. This is equivalent to almost doubling the number of structures tested by means of a given number of probe pads. This approach is directed to 2-node test structures, which might, for example, employ resistivity or conductivity as the tested parameter, such as contact chains, resistors and other 2-node test structures.

A feature of the present invention is to test initially a set of test structures by means of a first set of test structures to obtain a first set of measurements and then to reconfigure the set of test structures so as to obtain a second set of measurements after the first set of measurements has been completed. This reconfiguration of the test structures is analogous to the "ALT" key on a computer keyboard.

For example, a second parameter measurement performed by means of the probe pads after reconfiguration will furnish different information than the information provided during the first parameter measurement, since the array of test structures have been reconfigured in the period between the two sets of measurements.

In an embodiment of the present invention, the array of test structures is reconfigured by connecting the test structures by means of fuses, obtaining a first set of measurements from the test structures; disconnecting, or "blowing," the fuses; obtaining a second set of measurements; correlating the two sets of measurements so as to obtain individual parameter values for each of the test structures.

In the embodiment discussed above, in which the test structures are connected by means of fuses, the fuses can be any device suitable for interrupting current flow, for example, metal fuses or polysilicon fuses, among others, and the same techniques are employed as routing in redundancy circuits during die repair, i.e., the laser repair equipment "blows" the fuses in the redundancy circuits. Once the fuses in the array of test structures have been disconnected, some test structures will be cut off and will not interfere with the second set of measurements, allowing extraction of information about all test structures.

If the resistance of the polysilicon fuse raises concerns regarding accuracy of measurements, metal fuses can be used, i.e., a metal conductor running from the probe pad to the test structure, which conductor has a narrower section, permitting it to serve as a blowable fuse. Of course, to blow metal fuses, a laser beam has to be properly adjusted.

Figure 1:
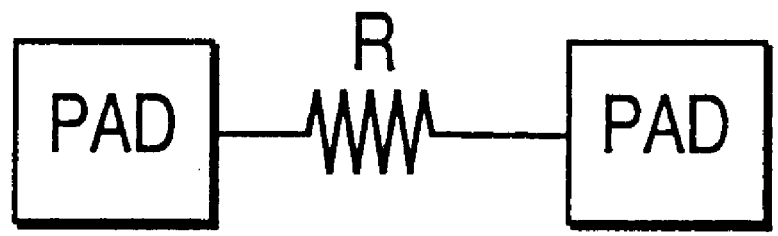
FIG. 1 is a diagram depicting the conventional arrangements of multiple probe pads provided in the prior art.
Figure 2:
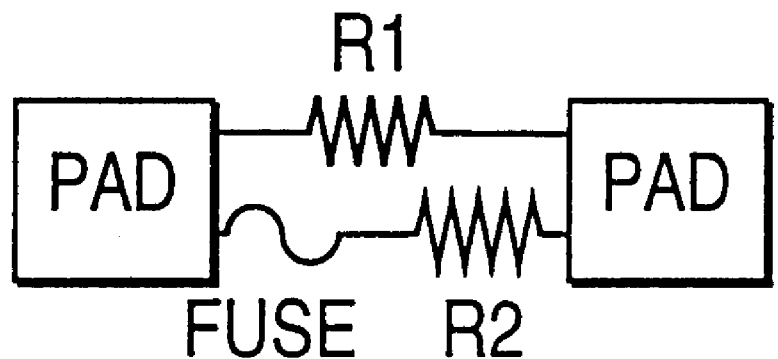
FIG. 2 depicts an embodiment of the present invention for arranging multiple probe pads.

The principle is simply illustrated: if you have two probe pads in place of the traditional arrangement of connecting one test structure, (for example, a thin film resistor or contact chain as in FIG. 1), the two test structures can be connected in parallel, with one of the parallel connections containing a fuse or fusible link, as in FIG. 2.

For example, in FIG. 2, the two resistors have resistance values $R_1$ and $R_2$. The first set of measurements provides the combined resistance, $R_{comb}$, which is equal to $$R_{comb} = \frac{R_1 \cdot R_2}{(R_1 + R_2)} \qquad (1)$$

This first measurement is then noted, perhaps by temporarily storing the value in a memory register by means of a software program running the tests.

Subsequent to the first measurement, the fuse is blown, thus removing resistance value $R_2$ from the measured resistance of the circuit. A second resistance measurement performed at this time furnishes a resistance value that reflects the $R_1$ value alone.

Rearranging equation (1) in relation to $R_2$, $$R_2 = \frac{R_{comb} \cdot R_1}{(R_1 - R_{comb})} \quad (2)$$

indicates that the measured values of $R_{comb}$ and $R_1$ permit determination of the value of an $R_2$ value, without direct measurement of $R_2$ alone and without sacrificing the accuracy of the measured value. The calculation employed in Equation (2) can be incorporated as a routine programmed manipulation performed by the measurement routine software program running the tests.

Figure 3:
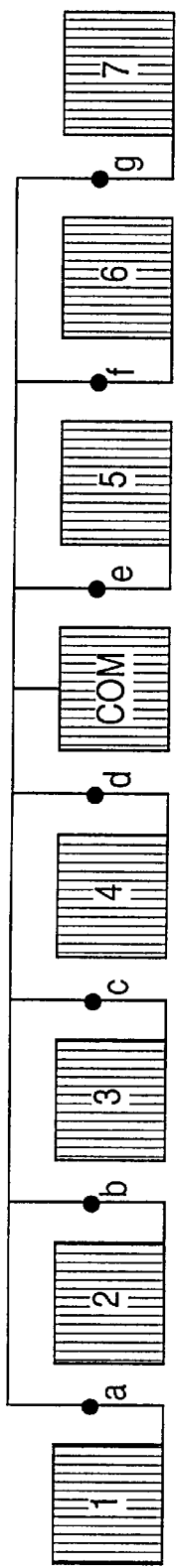
FIG. 3 illustrates the conventional test structure for parameter measurement.
Figure 4:
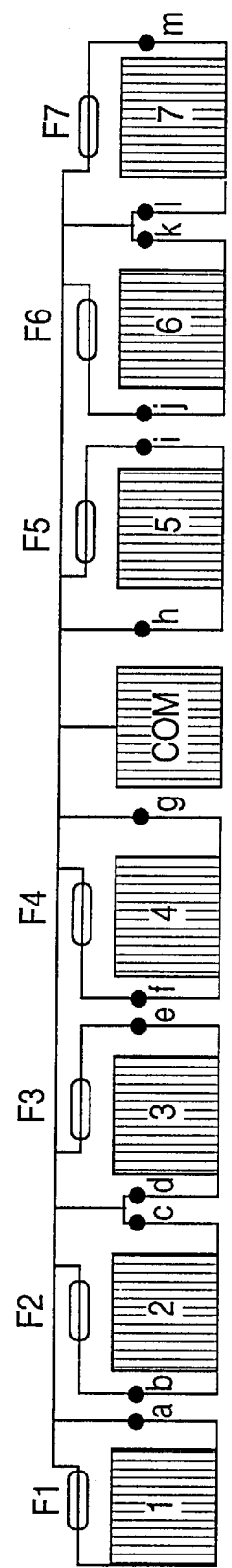
FIG. 4 is a depiction of an embodiment of the present invention, providing a test structure for parameter measurement.

The features of the present invention are further illustrated in FIGS. 3 and 4, where practical layouts of test structures are represented. For simplicity of illustration, only eight probe pads are indicated, one of which functions as the common lead, COM.

A traditional arrangement of test structures on a semiconductor device to be die-cut is presented in FIG. 3. In this setup, having one common lead pad, seven test structures can be tested—probe pad 1 measures the parameter for test structure a, probe pad 2 measures the parameter for test structure b, probe pad 3 measures the parameter for test structure c, probe pad 4 measures the parameter for test structure d, probe pad 5 measures the parameter for test structure e, probe pad 6 measures the parameter for test structure f, and probe pad 7 measures the parameter for test structure g. Thus, with the conventional arrangement of a test structure, eight probe pads allow for 2-node measurement of seven test structures.

FIG. 4 illustrates an embodiment of the present invention. Here, probe pad 1 measures the parameter for test structure a, but probe pad 2 measures the parameter for test structures b and c, probe pad 3 measures the parameter for test structures d and e, probe pad 4 measures the parameter for test structures f and g, probe pad 5 measures the parameter for test structures h and i, probe pad 6 measures the parameter for test structures j and k, and probe pad 7 measures the parameter for test structures l and m. Here, in contrast to the conventional arrangement provided in a test structure, eight probe pads allow for 2-node measurement of thirteen test structures. (Or, alternately, if only seven test structures are to be measured, then this can be accomplished by means of just four probe pads, thus, more fully utilizing substrate area.)

From the above comparison, it is apparent that the reconfigurable array of test structures of the present invention permits one to almost double the number of test structures tested with a given number of probe pads.

It is to be noted that probe pad 1 is unique: before the first set of measurements, it is shorted out by fusible link or fuse F1, which acts as a "signature," allowing the software program running the tests to determine which set of measurements is being performed and to process the results accordingly. In the example illustrated in FIG. 4, if the measured resistance between probe pad 1 and COM is zero, then the measurement corresponds to the first set of measurements before fuses F1, F2, F3, F4, F5, F6, and F7 have been blown. Alternatively, if the measured resistance between probe pad 1 and COM is greater than zero, then the measurement corresponds to the second set of measurements, i.e., after fuses F1, F2, F3, F4, F5, F6, and F7 have been blown.

In a preferred embodiment of the present invention, test structure a should have relatively high resistance, R>>O, so as to provide reliable discrimination between the sets of measurement. For instance, a polysilicon resistor could be employed.

Figure 5:
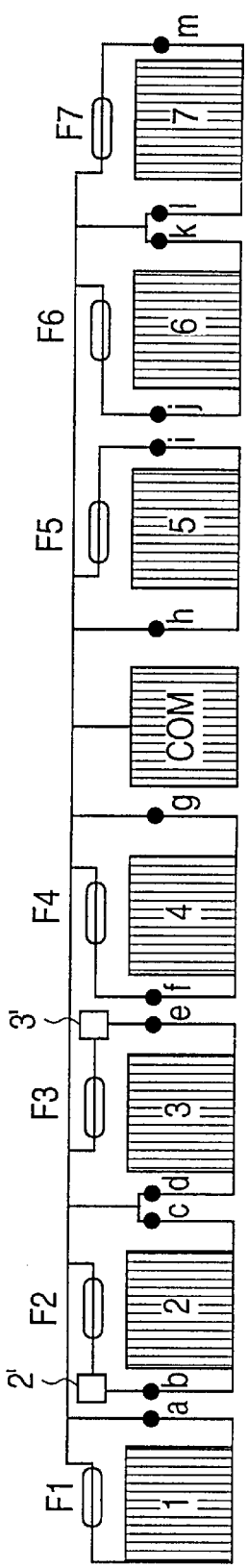
FIG. 5 is a depiction of another embodiment of the present invention, providing a test structure for parameter measurement.

It should also be noted that, if so desired, a small probe pad (intended for microprobing only) can be employed for one or more of the test structures, the micropad connected in series with the fusible link and the test structure, for example micropads 2' and 3' in FIG. 5. Thus, even after blowing or disconnecting fuses F2 and F3, test semiconductor device b can still be accessed and measured between pad 2 and micropad 2', and semiconductor device e can still be accessed and measured between pad 3 and micropad 3'. This permits re-verification of the test results in those instances which so require, for example, in failure analysis of customer-returned chips. The additional small microprobe pads 2' and 3' typically can be the same type of small probe pad as employed in circuit debugging. As such, the small probe pad would, for example, not be much wider than 3 to 4 times the width of the aluminum interconnects. Such probes are used in modern chips in significant numbers (several tens, for example) without significantly reducing the number of semiconductor devices which can be assembled on a given area of substrate.

In the typical manufacture of semiconductor devices, the number of probe pads serving to measure 2-node test structures easily exceeds 50. Accordingly, it can be expected that the present invention will furnish significant gains in space utilization on substrates and significant increases in the amount of information acquired from a given substrate area.

Although the present invention requires two measurements of a given parameter, this testing can often be combined with functional testing of the semiconductor device itself, which is usually done at least twice. Moreover, it is not anticipated that the time required for semiconductor manufacture will increase significantly as a result of this second set of measurements. Further, the laser can be programmed only to blow those fuses connected to devices chosen for parameter measurement.

Another embodiment of the present invention is one, in which the fuses have been swapped with the test structures such that the probe pad is first connected to the fuse; then, in turn, to the small microprobing pad; and then, in turn, to the test structure. The other node of the test structure is connected directly to the common pad, COM. Such an arrangement results in more convenient microprobing, since only one common pad will still be used, for example, common pad COM and micropad 2' are employed to re-test test structure b.

Numerous modifications and variations of the present invention are possible in light of the above teachings. It is therefore to be understood that within the scope of the appended claims, the invention may be practiced otherwise than as specifically described herein.

What is claimed is:

1. A reconfigurable array of test structures for testing portions of a semiconductor device, comprising:

a plurality of probe pads, including a first probe pad and a common lead;

a plurality of conductive connectors forming electrical connections, two of which are connected to each of said plurality of probe pads, except for said common lead;

a plurality of test structures, each of which is connected by said conductive connectors between said common lead and one of said plurality of probe pads; and a plurality of fusible links, wherein either some of said electrical connections between test structures and said common lead, or some of said electrical connections between said test structures and said probe pads, comprise one of said fusible links, such that a circuit comprising said common lead, one of said test structures and one of said probe pads may be broken by destroying a fusible link in the circuit.

2. The reconfigurable array of test structures according to claim 1, further comprising at least one microprobing pad connected in series by said conductive connectors between one of said fusible links and one of said test structures.

3. The reconfigurable array of test structures according to claim 1, wherein said fusible link comprises a fuse.

4. The reconfigurable array of test structures according to claim 3, in which said fuse is a polysilicon fuse.

5. The reconfigurable array of test structures according to claim 3, in which said fuse is a metal fuse.

6. The reconfigurable array of test structures according to claim 1, in which a fusible link is located between a probe pad and a test structure.

7. The reconfigurable array of test structures according to claim 1, in which a fusible link is located between said a structure and a common lead.

8. The reconfigurable array of test structures according to claim 1, in which said test structure is a resistor.

9. The reconfigurable array of test structures according to claim 8, in which said test structure is a thin film resistor.

10. The reconfigurable array of test structures according to claim 1, in which said test structure is a contact chain.

11. The reconfigurable array of test structures according to claim 1, in which said test structure is a contact.

12. The reconfigurable array of test structures according to claim 8, in which said testing is a test of resistance.

13. A method for testing portions of a semiconductor device, comprising the steps of:

assembling a plurality of test structures in a reconfigurable array of test structures, which reconfigurable array of test structures comprises a plurality of probe pads, a common lead, a plurality of test structures and a plurality of fusible links configured such that at least one circuit is formed in which two of said test structures are connected between one of said probe pads and said common lead with one of the two said test structures being connected in series with one of said fusible links;

making a first set of measurements between each of said plurality of probe pads and said common lead;

breaking the fusible links connected in series with said test structures;

making a second set of measurements between each of said plurality of probe pads and said common lead; and correlating said first set of measurements with said second set of measurements so as to obtain an individual parameter measurement for each test structure.

14. The reconfigurable array of test structures according to claim 1, wherein said conductive connectors connect two test structures to each of said probe pads.

15. The reconfigurable array of test structures according to claim 1, wherein said conductive connectors connect two test structures to each of said probe pads, except said first probe pad, and one of said fusible links is connected by said conductive connectors between said first probe pad and said common lead.

16. A method according to claim 13, further comprising:

designating a first probe pad which is connected in series through a fusible link to said common lead without an intervening test structure; and measuring the resistance between said first probe pad and said common lead to determine whether the fusible links have been broken.

* * * * *